(12) United States Patent
Ichitsubo et al.

(10) Patent No.: US 7,091,775 B2
(45) Date of Patent: *Aug. 15, 2006

(54) MULTI-BAND POWER AMPLIFIER MODULE FOR WIRELESS COMMUNICATION DEVICES

(75) Inventors: Ikuroh Ichitsubo, Kanagawa Prefecture (JP); Kanya Kubota, Shiga-ken (JP)

(73) Assignee: Micro Mobio Corporation, Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/173,968

(22) Filed: Jul. 2, 2005

(65) Prior Publication Data

US 2006/0158252 A1    Jul. 20, 2006

Related U.S. Application Data

(63) Continuation of application No. 11/039,687, filed on Jan. 19, 2005.

(51) Int. Cl.
*H03F 3/68* (2006.01)

(52) U.S. Cl. .................. 330/126; 330/124 R; 330/285; 330/296

(58) Field of Classification Search ................ 330/126, 330/124 R, 285, 295, 296
See application file for complete search history.

(56) References Cited

U.S. PATENT DOCUMENTS

| | | | |
|---|---|---|---|
| 5,050,238 A | 9/1991 | Tomizuka | |
| 5,164,683 A | 11/1992 | Shields | |
| 5,255,324 A * | 10/1993 | Brewer et al. | 381/107 |
| 5,656,972 A | 8/1997 | Norimatsu | |
| 5,732,334 A | 3/1998 | Miyake | |
| 6,075,995 A * | 6/2000 | Jensen | 455/552.1 |
| 6,151,509 A * | 11/2000 | Chorey | 455/552.1 |
| 6,175,279 B1 * | 1/2001 | Ciccarelli et al. | 330/296 |
| 6,366,788 B1 * | 4/2002 | Fujioka et al. | 455/553.1 |
| 6,417,730 B1 | 7/2002 | Segallis | |
| 6,483,398 B1 * | 11/2002 | Nagamori et al. | 333/116 |
| 6,625,050 B1 | 9/2003 | Suwa | |
| 6,639,466 B1 | 10/2003 | Johnson | |
| 6,694,129 B1 * | 2/2004 | Peterzell et al. | 455/76 |
| 2004/0203552 A1 * | 10/2004 | Horiuchi et al. | 455/333 |
| 2005/0179498 A1 * | 8/2005 | Tsutsui et al. | 330/285 |

* cited by examiner

*Primary Examiner*—Patricia Nguyen
(74) *Attorney, Agent, or Firm*—Tran & Associates

(57) ABSTRACT

A multi-band power amplifier module includes a first power amplifier that amplifies a first input radio frequency signal in a first frequency band in response to a first bias control signal. A second power amplifier amplifies a second input radio frequency signal in a second frequency band in response to a second bias control signal. A first bias control circuit produces the first bias control signal and a second bias control circuit produces the second bias control signal in response to step gain signals received at a step gain terminal.

20 Claims, 4 Drawing Sheets

Top View

MULTI-BAND POWER AMPLIFIER MODULE FOR WIRELESS COMMUNICATION DEVICES

RELATED APPLICATION

The present invention is continuation of U.S. application Ser. No. 11/039,687 filed on Jan. 19, 2005 entitled "MULTI-BAND PA MODULE FOR WIRELESS COMMUNICATION DEVICES" and related to the commonly assigned U.S. patent application Ser. No. 10/041,863, titled "Multi-layer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004, U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004. The disclosures of these related applications are hereby incorporated by reference.

BACKGROUND

The present invention relates to radio frequency (RF) power amplifiers (PA) module. Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of the wireless communication device is the radio frequency PA. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled by interconnected metal circuit and bond wires on a printed circuit board (PCB) having a dielectric substrate or a lead frame.

Among significant considerations in the miniaturization of RF amplifier circuits is the required impedance matching for the input and output RF signals of the amplifier. Input and output impedance matching circuits typically include capacitors, resistors, and inductors in associated transmission lines or micro strips for the RF signals into and out of the amplifier chip. However, these impedance matching circuits may require specifically tailored off-chip components located remotely from the amplifier IC chip. Accordingly, the application circuitry must include many electrical input and output terminals or bonding Pins to which the corresponding portions of the off-chip impedance matching circuits are separately joined. This increases the difficulty of assembly and required size of the associated components, and affects the overall manufacturability of the portable devices.

One important requirement for the state-of-the-art wireless devices is to provide power amplification in a plurality of frequency bands. The quality and power level of the amplified RF signals need to be properly controlled. The amplification of RF signals is required to be linear over a wide signal power range in each of the plurality of frequency bands. Preferably the amplification is reduced or increased according to input RF signal, transmittance range and data rate so that power consumption can be optimized.

SUMMARY

In one aspect, the present application relates to a multi-band power amplifier module, comprising:
  a step gain terminal configured to receive a first step gain signal and a second step gain signal;
  a first power amplifier configured to amplify a first input radio frequency signal in a first frequency band in response to a first bias control signal to produced a first output radio frequency signal;
  a first bias circuit configured to output the first bias control signal in response to the first step gain signal at the step gain terminal;
  a second power amplifier configured to amplify a second input radio frequency signal in a second frequency band in response to a second bias control signal to produced a second output radio frequency signal; and
  a second bias circuit configured to output the second bias control signal in response to the second step gain signal at the step gain terminal.

In another aspect, the present application relates to a multi-band power amplifier module, comprising:
  a power sensing terminal configured to receive a first power sensing signal and a second power sensing signal;
  a first power amplifier configured to amplify a first input radio frequency signal in a first frequency band in response to the first power sensing signal to produced a first output radio frequency signal;
  a first power sensing circuit configured to output the first power sensing signal at the power sensing terminal;
  a second power amplifier configured to amplify a second input radio frequency signal in a second frequency band in response to the second power sensing signal to produced a second output radio frequency signal; and
  a second power sensing circuit configured to output the second power sensing signal at the power sensing terminal.

An advantage of the present invention is that the power amplifier is capable of amplifying radio frequency signals in a plurality of frequency bands with efficient circuit. The power amplifiers module include power sensing circuits and bias control circuits that optimally control the bias current and operation characteristics of the power amplifiers. As a result, the quality, the linearity, and current consumption of the amplified signals are significantly improved across a plurality of frequency bands over a wide dynamic range. The frequency range can cover from several megahertz (MHZ) to tens of gigahertz (GHZ).

The power sensing bias control circuits for different power amplifiers operating at different frequency bands can be integrated within the RF amplifier module. In particular, the power sensing and the bias control terminals can be shared among different power amplifiers to reduce foot print of the power amplifier module. The integrated RF amplifier module is therefore compact and lower cost.

The plurality of power supply terminals can be provided to supply power to each power amplifier. The flexibility of providing power from one or more power supply terminals enables greater amount power being supplied to the power amplifiers, which is crucial for wireless applications requiring high power amplification for Wi-Fi and Wi-Max applications.

The power amplifier circuit can be fabricated on semiconductor materials such as Gallium Arsenide Heterojunction Bipolar Transistors (GaAsHBT). The RF power amplifier module can include a multi-layer three-dimensional substrate or a lead frame having a bottom metal layer adapted to bond with the printed circuit board (PCB) of a wireless communication device. The substrate can include one or more upper layers adapted to receive the amplifier chip and other off-chip components. The bottom layer includes grounding metal Pins that are located at the center and at each corner, which is registered and adapted to bond with the circuit pattern on PCB of the wireless communication device. The metal Pins are connected to the upper layers through the multilayer three-dimensional substrate by a plurality of metal via holes.

The RF amplifier module is suitable to applications in various wireless data and voice communications standards and protocols, including Global System for Mobile Communications (GSM), General Packet Radio Service (GPRS), Code Division Multiple Access (CDMA), Wideband CDMA, Universal Mobile Telecommunications System (UMTS), IEEE 802.11, IEEE 802.16 (Wi-Max), and others. The PA module in accordance to the present invention especially provides reliable amplification to the Wi-Fi and Wi-Max applications.

Additional features and advantages of the invention will be set forth in the description, which follows, and in part will be obvious from the description, or may be learned by the practice of the invention. The features and advantages of the invention may be realized and obtained by means of the instruments and combinations particularly pointed out in the appended claims. These and other features of the present invention will become apparent from the following description and appended claims, or may be learned by the practice of the invention as set forth hereinafter.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
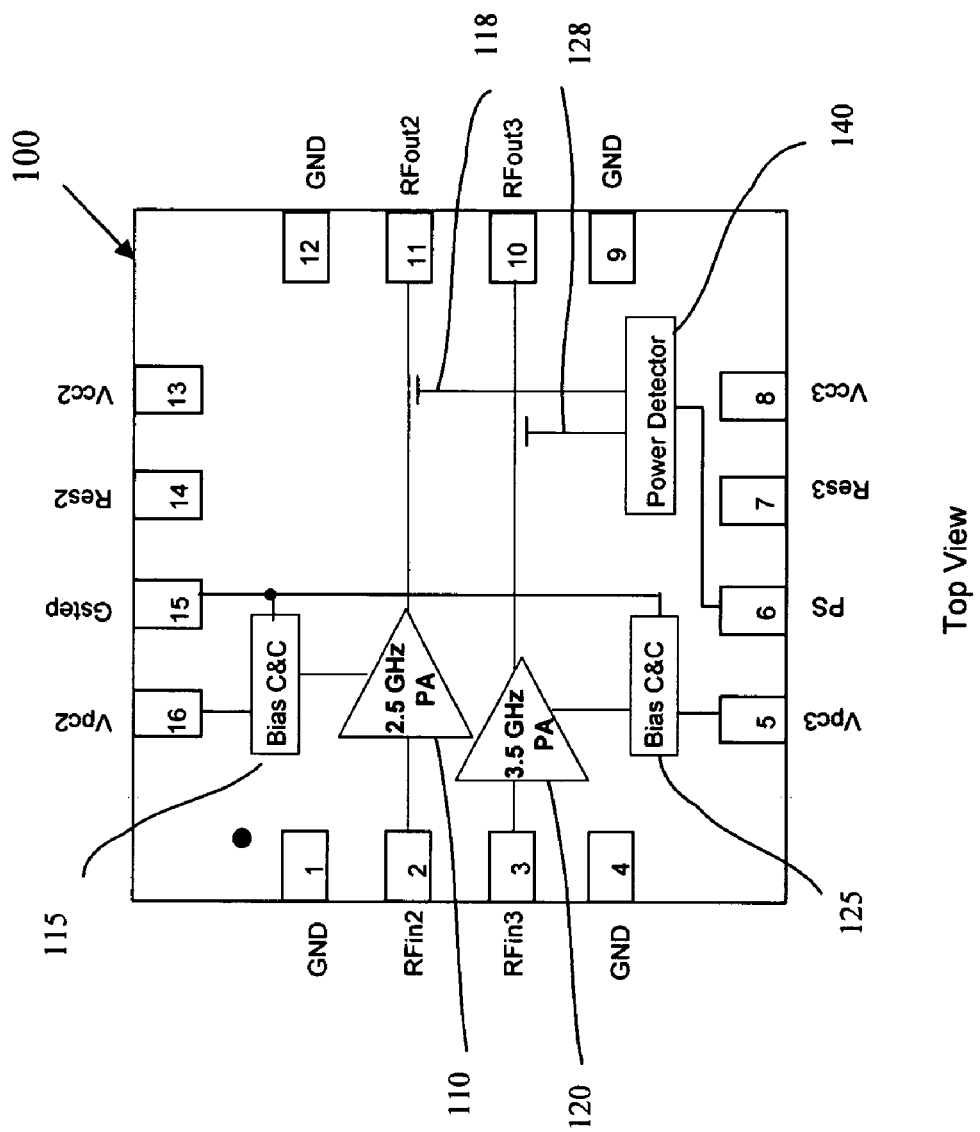
FIG. 1 illustrates a top view diagram of a power amplifier module capable of amplifying radio frequency signals at two radio frequency bands in accordance to an embodiment of the present invention.

As shown in FIG. 1, a power amplifier module 100 provides a unitary or common component that may be conveniently assembled in wireless devices such as cellular phone, mobile computers, handheld wireless digital devices, and for Wi-Fi and Wi-Max applications. In the present invention, the term "module" refers to such a unitary device for wireless communications, comprising integrated power amplifiers and other circuitry and auxiliary electronic components. The power amplifier module 100 is capable of amplifying radio frequency signals in a plurality of frequency bands. As shown in the top view diagram of FIG. 1, the power amplifier module 100 comprises a first power amplifier 110 and a second power amplifier 120. For example, the first power amplifier 110 can amplify radio frequency signals in a frequency band centered around 2.5 GHz. The second power amplifier 120 can amplify radio frequency signals in a frequency band centered around 3.5 GHz. The power amplifier module 100 is compatible with other radio frequencies such as 5 GHz, 700 MHz, etc.

The power amplifier module 100 includes four sides and a plurality of metal electrodes (often referred as pins or terminals) along each side. The pins or terminals can provide RF signal input and control signal input to the power amplifiers as well as output RF or power sensing signals. As shown in FIG. 1, the power amplifier module 100 includes an input side on the left having pins 1 and 4 as ground, and pin 2 (RFin2) and pin 3 (RFin3) respectively for receiving input RF signals for the first power amplifier 110 and the second power amplifier 120. The power amplifier module 100 also includes an output side on the right having pins 9 and 12 as ground, and pin 11 (RFout2) and pin 10 (RFout3) respectively for receiving output RF signals from the first power amplifier 110 and the second power amplifier 120. The upper side of the power amplifier module 100 includes pin 16 (Vpc2) for receiving input signals to bias control circuit 115 for the first power amplifier 110. The lower side of the power amplifier module 100 includes pin 5 (Vpc3) for receiving input signals to bias control circuit 125 for the second power amplifier 120.

In accordance with one embodiment of the present invention, pin 15 (Gstep or gain step) along the upper side of the power amplifier module 100 receives step gain signals for both the bias control circuit 115 and the bias control circuit 125. The amplified RF signals output from the first power amplifier 110 and the second power amplifier 120 can be detected respectively by capacitance coupling 118 and 128. In response, a power sensing circuit 140 produces power-sensing signals at pin 6 (PS). Since only one of the two power amplifiers 110 and 120 are in operation at each time, the power sensing signals from the two power amplifiers 110 and 120 can be output at a shared terminal at pin 6. The sharing of the power sensing terminal at pin 6 and the step gain control terminal at pin 15 reduces the number of pins, the footprint, and manufacturing cost of the power amplifier module 100.

In accordance with another embodiment of the present invention, the upper side of the amplifier module 100 includes two power supply pins 13 (Vcc2) and 14 (Res2). In low power amplifying applications, the power is supplied to the first power amplifier circuits by pin 13 whereas pin 14 is used as a reserved power supply pin. Both pins 13 and 14 an be used for supplying power for high power applications such as Wi-Fi and Wi-Max wireless applications. Similarly, the lower side of the amplifier module 100 also includes a power supply pin 8 (Vcc3) and a reserved power supply pin 7 (Res3).

Figure 2:
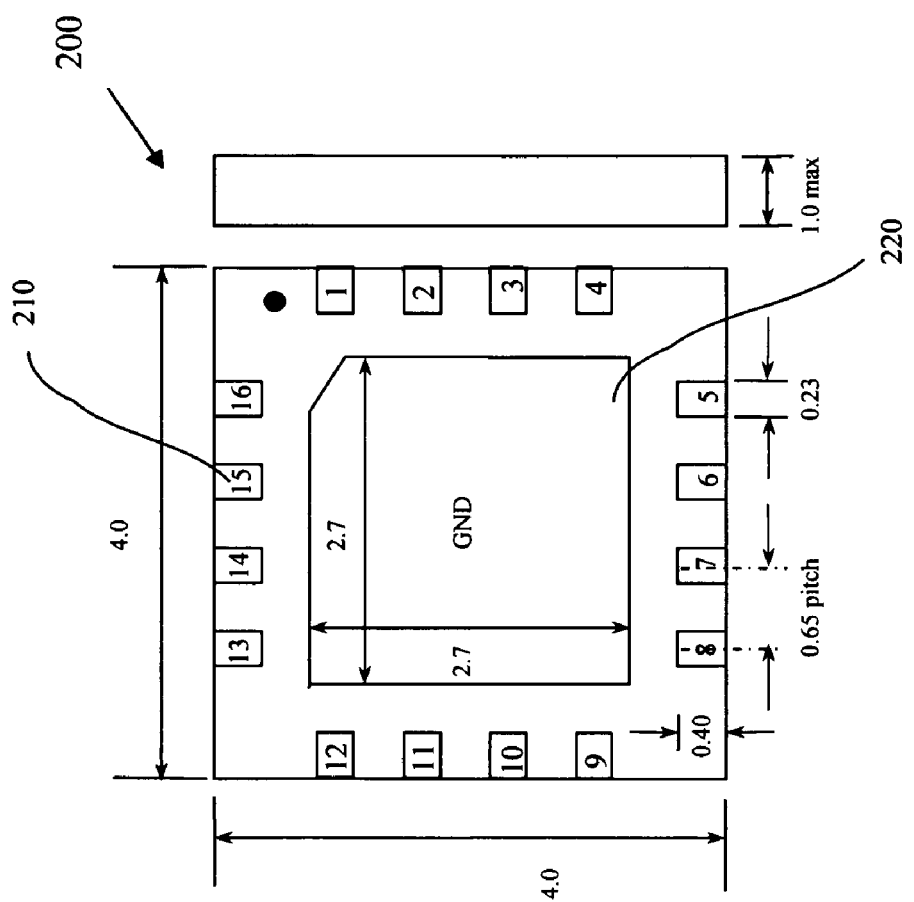
FIG. 2 is a bottom view of electrical layout of the power amplifier module of FIG. 1.

The bottom view of the power amplifier module 100 is shown in FIG. 2. The pin-out 200 of the power amplifier module 100 when viewed from the bottom is flip symmetry of the pin-out when viewed from the top. Exemplified dimensions are also labeled in FIG. 2 in millimeter) to show the small foot print of the power amplifier module 100 which are achieved by integrated circuit designs and shared electrodes between the power amplifiers for different frequency bands.

The power amplifier module 100 can further comprise frequency filter circuits and diplexers that can receive the input radio frequency signals and output a radio frequency signal at a selective frequency (e.g. one of 2.5 GHz and 3.5 GHz). Details of frequency circuit and diplexer are disclosed in the above referenced and commonly assigned U.S. patent application Ser. No. 10/972,858, titled "Frequency filtering circuit for wireless communication devices" by Kubota et al, filed Oct. 25, 2004, filed and U.S. patent application Ser. No. 10/972,636, titled "Diplexer circuit for wireless communication devices" by Kubota et al, filed Oct. 25, 2004, the disclosures of which are hereby incorporated by reference.

Figure 3:
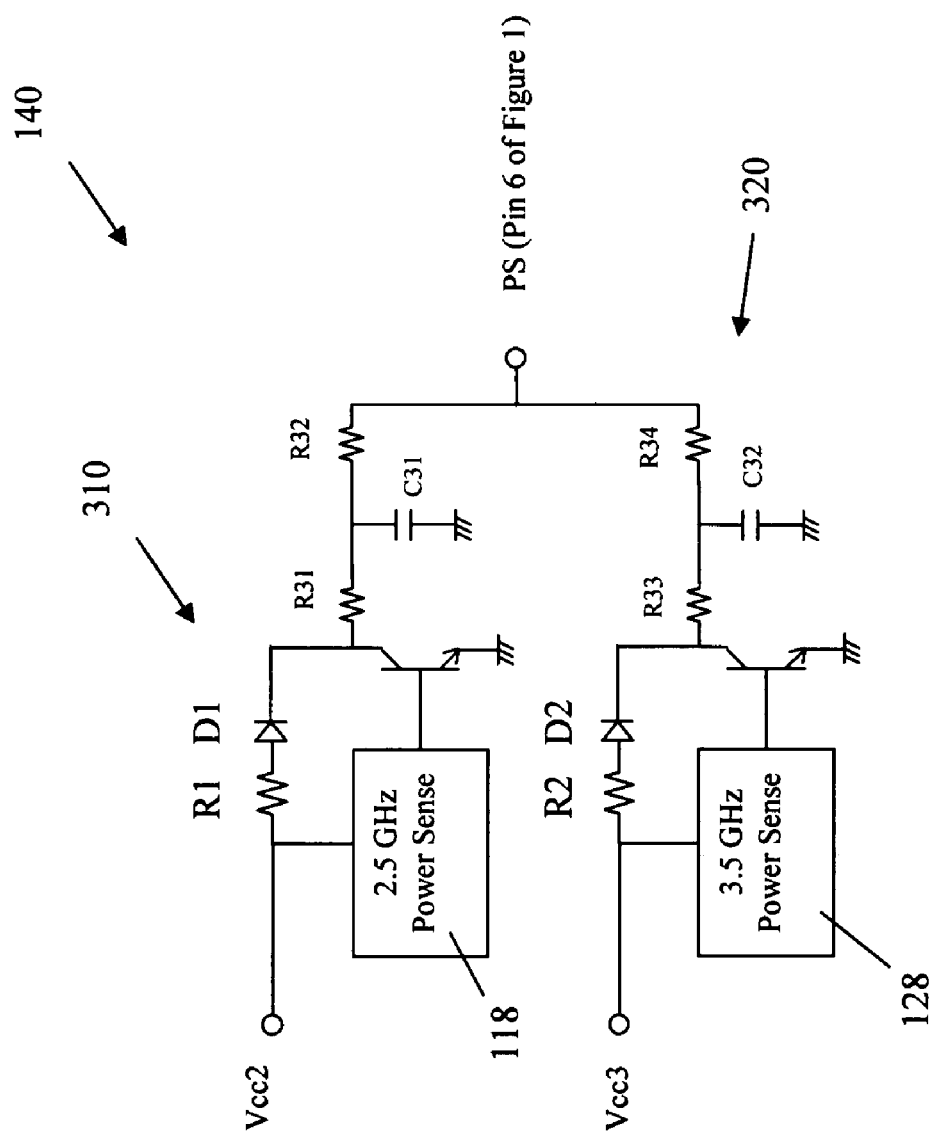
FIG. 3 illustrates power-sensing circuits for the two power amplifiers sharing the same terminal for power sensing output.

FIG. 3 illustrates power-sensing circuit 140 that is configured to detect amplified RF signals output from the first and the second power amplifiers 110 and 120. The power sensing circuit 140 includes a first power sensing circuit 310 and a second power sensing circuit 320. The first power sensing circuit 310 receives the amplified RF signals output from the first power amplifier 110 detected by capacitance coupling 118. The detected amplified RF signals are amplified by a transistor through the coupling of a resistor R1 and diode D1. The power sensing signals produced as a result are coupled by a RC circuit to pin 6 (PS) of the power amplifier module 100 (shown in FIG. 1). The amplified RF signals from the second power amplifier 120 are similarly detected by capacitance coupling 128, amplified and coupled by another RC circuit to the same electrode pin 6 (PS) of the power amplifier module 100 in FIG. 1.

Diodes D1 and D2 in the first power sensing circuit 310 and a second power sensing circuit 320 are critical in preventing undesirable reverse coupling of signals from the power sensing output pin 6 back to the amplifier output circuits. As a result, power-sensing circuits are integrated between different frequency bands to enable small device footprint without introducing cross-band interference.

Figure 4:
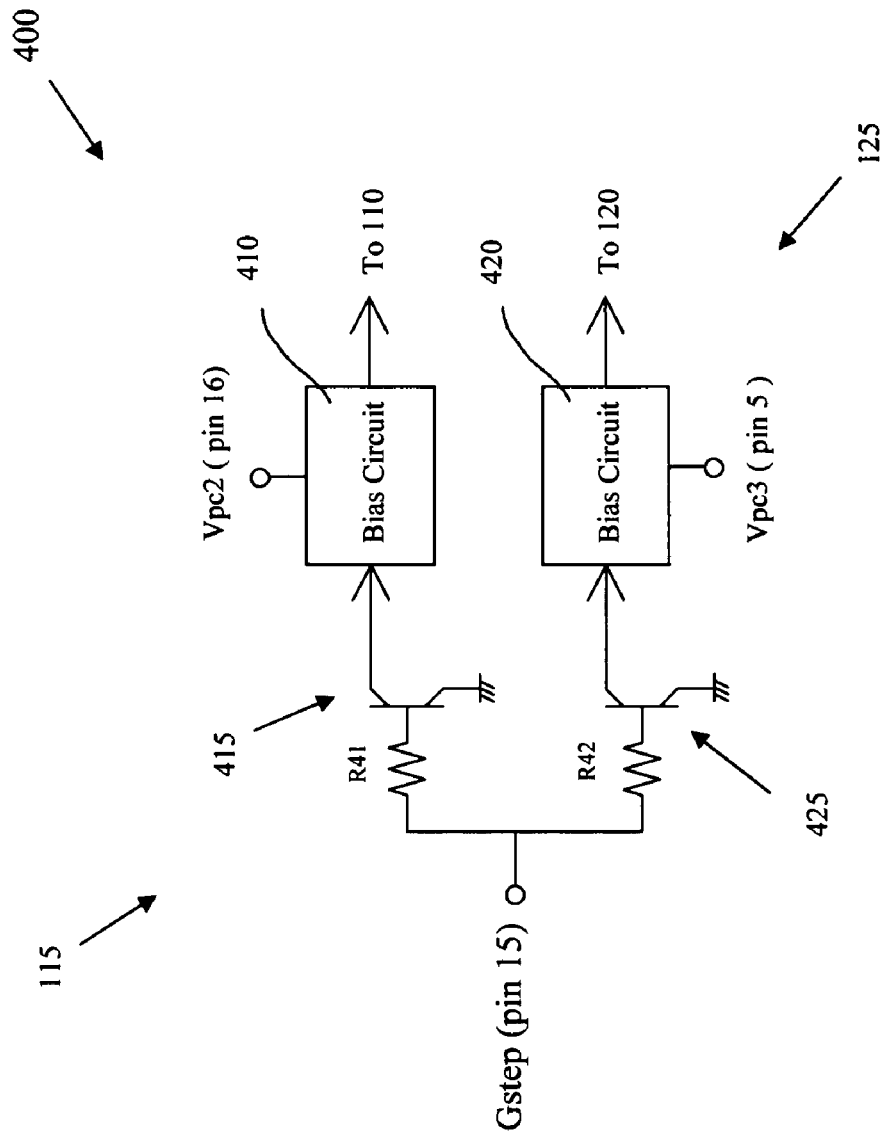
FIG. 4 illustrates bias control circuits for the two power amplifiers sharing the same step gain terminal.

FIG. 4 shows the bias control circuit 400 that includes the bias control circuit 115 and the bias control circuit 125 respectively controlling the bias voltages of the first power amplifier 110 and the second power amplifier 120 for amplifying RF signals in the two frequency bands (e.g. 2.5 GHz and 3.5 GHz). The first bias circuits 410 receive DC power at Vpc2 (pin 16 of FIG. 1). The second bias circuits 420 receive DC power at Vpc3 (pin 5). The bias circuit 400 receives a gain control signal at gain control (pin 15). The gain control signal is coupled with the first bias circuits 410 by a switch circuit that comprises a resistor R41 and a transistor 415. The gain control signal is coupled with the second bias circuits 420 by a switch circuit that comprises a resistor R42 and a transistor 425.

The first power amplifier 110 is controlled by a bias control circuit 115 and a power sensing circuit 140. The bias control circuit 115 is configured to output a first bias control signal and a second bias control signal depending on the voltage value of the gain control signal at step gain (pin 15). The first power amplifier 110 amplifies the input radio frequency signals by a first gain in response to the first bias control signal and by a second gain in response to the second bias control signal. The multiple bias control signals and multiple gains are designed to broaden the dynamic gain range for the power amplifier module 100. For example, the range of the gain for each of the first gain and the second gain can cover a range of 20 db. The first gain can be 20 db or higher than the second gain. The amplification at each of the first gain and the second gain can be referred to as an amplification mode. For example, the power amplifier 110 can perform at a low gain amplification mode and a high gain amplification mode. The bias control circuit 125 is similarly configured to output a first bias control mode and a second bias control mode to control the gains of the second power amplifier 120 for amplifying radio frequency signals at 3.5 GHz.

In another embodiment, the bias control circuit 115 or the bias control circuit 125 can output three bias control modes. The three additive amplification modes can be referred as step gains. Each of the bias control mode can control the first power amplifier 110 to amplify the input radio frequency signals by a different gain. The first gain can be 20 db or higher than the second gain. The second gain can be 20 db or higher than the third gain. The three amplification modes of amplification can realize an amplification range of 40 dB or more. Similarly, a bias circuit can output four or more bias control signals to enable the power amplifier to realize an amplification range of 60 db or more.

Other details of the operations of the bias control circuits 115 and 125 and power sensing circuit 140 as well as the design and benefits of the electric grounding in wireless power amplifier modules are disclosed in the commonly assigned and the above mentioned U.S. patent application Ser. No. 10/041,863, titled "Multilayer RF Amplifier Module" by Wang, et al., filed on Oct. 22, 2001, U.S. patent application Ser. No. 10/385,058, titled "Power amplifier Module for wireless communication devices" by Ichitsubo et al, filed on Mar. 9, 2003, U.S. patent application Ser. No. 10/385,059, titled "Accurate Power Sensing Circuit for Power Amplifiers by Ichitsubo et al, filed on Mar. 9, 2003, U.S. patent application Ser. No. 10/804,737, titled "RF front-end module for wireless communication devices" by Ichitsubo et al., filed Mar. 18, 2004. The disclosures of these applications are incorporated herein by reference.

Although specific embodiments of the present invention have been illustrated in the accompanying drawings and described in the foregoing detailed description, it will be understood that the invention is not limited to the particular embodiments described herein, but is capable of numerous rearrangements, operating frequency bands, modifications, and substitutions without departing from the scope of the invention. For example, the frequency of a power amplifier is not restricted to 2.5 GHz or 3.5 GHz. The described system is compatible with power amplification at 5 GHz, 700 MHz, or any other radio frequencies. The following claims are intended to encompass all such modifications.

What is claimed is:

1. A multi-band power amplifier module, comprising:
   a first power amplifier configured to amplify a first input radio frequency signal in a first frequency band in response to a first bias control signal to produce a first output radio frequency signal;
   a first bias circuit configured to output the first bias control signal in response to a first step gain signal at a step gain terminal;
   a second power amplifier configured to amplify a second input radio frequency signal is a second frequency band in response to a second bias control signal to produce a second output radio frequency signal; and
   a second bias circuit configured to output the second bias control signal in response to a second step gain signal at the step gain terminal.

2. The multi-band power amplifier module of claim 1, further comprising
   a power sensing terminal configured to receive a first power sensing signal and a second power sensing signal;
   a first power sensing circuit configured to produce the first power sensing signal at the power sensing terminal, wherein the first power amplifier is configured to amplify the first input radio frequency signal in the first frequency band in response to the first power sensing signal; and
   a second power sensing circuit configured to produce the second power sensing signal at the power sensing terminal, wherein the second power amplifier is configured to amplify the second input radio frequency signal in the second frequency band in response to the second power sensing signal.

3. The multi-band power amplifier module of claim 2, wherein the first power sensing circuit detects the first output radio frequency signal to produce the first power sensing signal at the power sensing terminal.

4. The multi-band power amplifier module of claim 3, wherein the first power sensing circuit detects the first output radio frequency signal by capacitance coupling.

5. The multi-band power amplifier module of claim 1, further comprising
   two or more power supply terminals, wherein at least one power supply terminal is configured to supply power to the first power amplifier.

6. The multi-band power amplifier module of claim 5, wherein two or more power supply terminals simultaneously supply power to the first power amplifier.

7. The multi-band power amplifier module of claim 5, wherein the two or more power supply terminals and a step gain terminal are disposed along one side of the multi-band power amplifier module.

8. The multi-band power amplifier module of claim 1, wherein the frequency band is centered at about 2.5 GHz, 3.5 GHz, or 5 GHz.

9. The multi-band power amplifier module of claim 1, further comprising
   a first input terminal configured to receive the first input radio frequency signal in the first frequency band;
   a second input terminal configured to receive the second input radio frequency signal in the second frequency band; and
   one or more ground terminals connected to the to the first power amplifier or the second power amplifier;
   wherein the first input terminal, the second input terminal, and the one or more ground terminals are disposed along one side of the multi-band power amplifier module.

10. The multi-band power amplifier module of claim 1, further comprising
    a first output terminal configured to receive the first output radio frequency signal;
    a second output terminal configured to receive the second output radio frequency signal; and
    one or more ground terminals connected to the to the first power amplifier or the second power amplifier;
    wherein the first output terminal, the second output terminal, and the one or more ground terminals are disposed along one side of the multi-band power amplifier module.

11. A multi-band power amplifier module comprising:
    a power sensing terminal configured to receive a first power sensing signal and a second power sensing signal;
    a first power amplifier configured to amplify a first input radio frequency signal in a first frequency band in response to the first power sensing signal to produce a first output radio frequency signal;
    a first power sensing circuit configured to produce the first power sensing signal at the power sensing terminal;
    a second power amplifier configured to amplify a second input radio frequency signal in a second frequency band in response to the second power sensing signal to produced a second output radio frequency signal;
    a second power sensing circuit configured to produce the second power sensing signal at the power sensing terminal;
    a step gain terminal configured to receive a first step gain signal and a second step gain signal;
    a first bias control circuit configured to output a first bias control signal in response to the first step gain signal at the step gain terminal wherein the first power amplifier is configured to amplify the first input radio frequency signal in the first frequency band in response to the first bias control signal; and
    a second bias control circuit configured to output the second bias control signal in response to the second step gain signal at the step gain terminal, wherein the second power amplifier is configured to amplify the second input radio frequency signal in the second frequency band in response to the second bias control signal.

12. The multi-band power amplifier module of claim 11, wherein the first power sensing circuit detects the first output radio frequency signal to produce the first power sensing signal at the power sensing terminal.

13. The multi-band power amplifier module of claim 12, wherein the first power sensing circuit detects the first output radio frequency signal by capacitance coupling.

14. The multi-band power amplifier module of claim 11, further comprising
    a step gain terminal configured to receive a first step gain signal and a second step gain signal;
    a first bias control circuit configured to output a first bias control signal in response to the first step gain signal at the step gain terminal, wherein the first power amplifier is configured to amplify the first input radio frequency signal in the first frequency band in response to the first bias control signal; and
    a second bias control circuit configured to output the second bias control signal in response to the second step gain signal at the step gain terminal, wherein the second power amplifier is configured to amplify the second input radio frequency signal in the second frequency band in response to the second bias control signal.

15. The multi-band power amplifier module of claim 11, further comprising
two or more power supply terminals, wherein at least one power supply terminal is configured to supply power to the first power amplifier.

16. The multi-band power amplifier module of claim 15, wherein two or more power supply terminals simultaneously supply power to the first power amplifier.

17. The multi-band power amplifier module of claim 15, wherein the two or more power supply terminals and the power sensing terminal are disposed along one side of the multi-band power amplifier module.

18. The multi-band power amplifier module of claim 11, wherein the frequency band is centered at about 2.5 GHz, 3.5 GHz, or 5 GHz.

19. The multi-band power amplifier module of claim 11 further comprising
a first input terminal configured to receive the first input radio frequency signal in the first frequency band;
a second input terminal configured to receive the second input radio frequency signal in the second frequency band; and
one or more ground terminals connected to the to the first power amplifier or the second power amplifier;
wherein the first input terminal, the second input terminal, and the one or more ground terminals are disposed along one side of the multi-band power amplifier module.

20. The multi-band power amplifier module of claim 11, further comprising
a first output terminal configured to receive the first output radio frequency signal;
a second output terminal configured to receive the second output radio frequency signal; and
one or more ground terminals connected to the to the first power amplifier or the second power amplifier;
wherein the first output terminal, the second output terminal, and the one or more ground terminals are disposed along one side of the multi-band power amplifier module.

* * * * *